United States Patent [19]
Livolsi

[11] Patent Number: 6,046,610
[45] Date of Patent: Apr. 4, 2000

[54] SELF-BIASED DIFFERENTIAL RECEIVER CELLS FOR CMOS

[75] Inventor: Robert R. Livolsi, Shokan, N.Y.

[73] Assignee: International Business Machines Corporation, Armonk, N.Y.

[21] Appl. No.: 09/072,220

[22] Filed: May 4, 1998

[51] Int. Cl.[7] ....................................................... H03F 3/45
[52] U.S. Cl. .............................. 327/66; 327/563; 330/261
[58] Field of Search ................................. 327/65, 66, 67, 327/563, 52, 53, 54; 330/261

[56] References Cited

U.S. PATENT DOCUMENTS

| | | | |
|---|---|---|---|
| 4,079,301 | 3/1978 | Johnson, III | 388/803 |
| 4,280,091 | 7/1981 | Hiltner | 323/315 |
| 4,535,294 | 8/1985 | Ericksen et al. | 327/58 |
| 4,791,324 | 12/1988 | Hodapp | 327/53 |
| 5,475,323 | 12/1995 | Harris et al. | 327/67 |
| 5,485,119 | 1/1996 | Kimura | 327/349 |
| 5,525,919 | 6/1996 | Phelan | 327/52 |
| 5,600,269 | 2/1997 | Song et al. | 327/52 |
| 5,850,157 | 12/1998 | Zhu et al. | 327/295 |

OTHER PUBLICATIONS

"Switch Mode Power Supply for CRT Display" IBM Technical Disclosure Bulletin, vol. 29, No. 9, Feb. 1987, pp. 3921–3922.

"Transistor Rectifier–Regulator" IBM Technical Disclosure Bulletin, vol. 22, No. 6, Nov. 1979, pp. 2319–2320.

*Primary Examiner*—Margaret R. Wambach
*Assistant Examiner*—Terry L. Englund
*Attorney, Agent, or Firm*—Lynn L. Augspurger

[57] ABSTRACT

A differential receiver cell circuit is provided for a CMOS chip for use in chip to chip interfaces. The differential receiver cell is testable to enable the testing of the functioning of other circuits on the CMOS chip. The receiver cell is provided (between a voltage source VDD! and ground GND!) with a bias switch circuit comprising a PFET T115 having its drain connected to the receiver cell's voltage source. This source has a node VDD! connected to a self biasing network composed of PFET T106 and NFET T107 whose input node NB and output are connected to control a current controlling device NFET T118 whose drain is connected to a common node NA and whose source is coupled to ground.

5 Claims, 1 Drawing Sheet

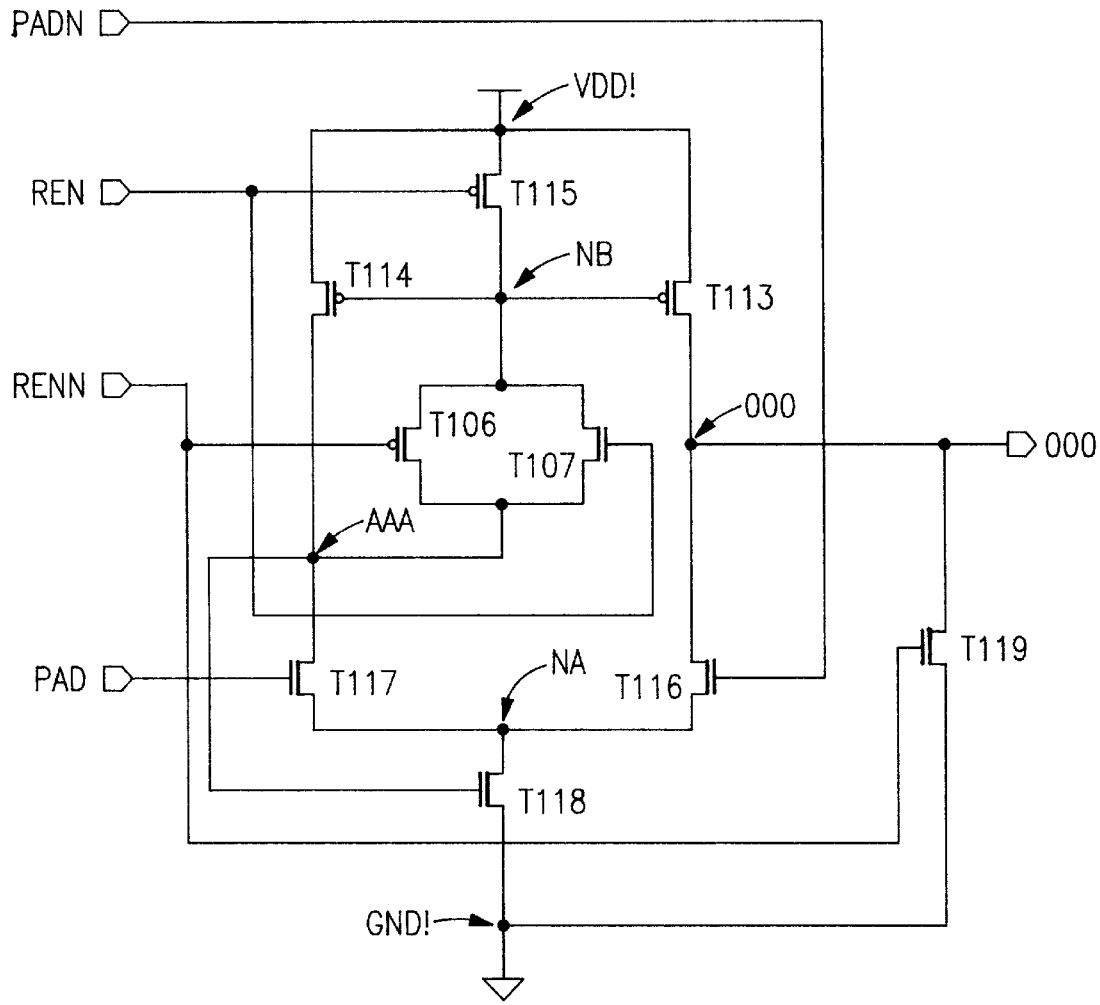

SELF-BIASED DIFFERENTIAL RECEIVER CELLS FOR CMOS

FIELD OF THE INVENTION

This invention is related to CMOS circuits for chip crossing interfaces in computer modules, and particularly to differential receiver cell circuits.

BACKGROUND OF THE INVENTION

It would be desirable to increase the common mode range of cells used in receiver circuits as such circuits have caused complexity of design particularly in cells used in CMOS circuits for chip interfaces. A common mode range is the DC operating range of a circuit which functions normally.

SUMMARY OF THE INVENTION

This invention provides a differential receiver with increased common node range of voltage input which can be made in CMOS technology and allows use of a wider range of technology in circuits which are combined in a system.

For a better understanding of the invention refer to the description and to the drawing.

BRIEF DESCRIPTION OF THE DRAWINGS

FIG. 1 shows schematically the preferred embodiment of my differential receiver cell.

DETAILED DESCRIPTION OF THE INVENTION

Turning now to our invention in greater detail, it will be seen from FIG. 1 which illustrates the preferred embodiment of my differential receiver cell with increased common node range of voltage input which can be used in CMOS and as a complementary metal oxide semiconductor cell used in chip to chip interfaces.

The differential receiver cell is the circuit shown in FIG. 1 which will be understood as being formed on a silicon substrate in CMOS technology. The input and PAD line for data input to the cell is connected to the gate of NFET T117. Data output is provided with the voltage value at node OOO at the pad OOO. The overall circuit having the differential receiver cell illustrated which is testable has between a voltage source (positive normally) node to check whether other circuits are functioning VDD!, and the ground node GND! a bias switch circuit comprising a bias switch PFET T115 having its source connected to the voltage source VDD!, its drain connected to a self biasing network composed of PFET T106 and NFET T107 whose node NB provides inputs and having its output node AAA connected to control a current controlling device NFET T118 whose drain is connected to a common node NA and whose source is connected to ground GND!.

The cell has a data input pad along PAD line to the gate of input NFET T117 whose source is connected to common node NA. The cell also has input PADN along PADN line to the gate of NFET T116 whose source is connected to common node NA. Common node NA is connected to the drain of current controlling device NFET T118 whose source is connected to ground GND!. The drain of input device NFET T117 is connected to the drain (the drain representing a lessor or lower voltage potential on an PFET) of current mirror device PFET T114 at node AAA.

The drain of the second input device NFET T116 is connected to the drain of current mirror device PFET T113 at node OOO. The gates of both current mirror devices PFET T114 and PFET T113 are connected to the common node NB which is connected to the self biasing circuit described above. The voltage signals present at both inputs PAD and PADN are complimentary in nature so that if the signal present on input pin PAD is a high level signal then the signal present on input pin PADN is a low level signal. When the input pin REN (receiver enable) is at a high level logical signal equivalent to node voltage VDD! and the input pin RENN (compliment of receiver enable) is at a low level logical signal equivalent to node voltage GND! then this signal is applied to the gates of self biasing devices NFET T107 and PFET T106 and they are turned on by and the bias the gate of control device bias switch when PFET T115 is turned off by the bias so then the circuit is biased in a manner to receive data at the input pins PAD and PADN. When the signal at input pin PAD is at a high level and the input signal at input pin PADN is at a low level then the circuit is such that input device NFET T117 is on and the second input device NFET T116 is off. This causes input NFET T117 to steer current from mirror device PFET T114 causing the voltage at a second bias node AAA (that set the differential receiver all's gain ) to fall causing the voltage to drop across self biasing devices NFET T107 and PFET T106 causing bias node NB to drop driving the gates of mirror devices PFET T114 and PFET T113 to turn on harder causing the voltage at Output node OOO to rise to a logical high signal. The signal drop at node AAA also drives the gate of current control device NFET T118 to drop causing NFET T118 to drive less causing NFET T116 to be off causing voltage at node OOO to rise. When the signal at input pin PAD is at a low level and the signal at input pin PADN is at a high level then input NFET T117 is turned off while second input NFET T116 is turned on causing voltage at node AAA to rise causing voltage across self bias devices PFET T106 and NFET T107 to rise causing the gate voltage of mirror devices PFET T114 and PFET T1 13 to rise turning said mirror devices off causing voltage at gate of current control device NFET T118 to turn on causing second input devices (T116 or T117) to turn on harder causing voltage at node OOO to fall to a logical low level. When the signal at input pin REN is a logical low level equivalent to voltage at node GND! and the signal at input pin RENN is a logical high signal equivalent to VDD! then this signal is applied to the gates of self bias devices PFET T106 and NFET T107 which are turned off and the signal is applied to the gate of control device PFET T115 which is turned ON causing voltage at node NB to rise to the level of VDD! causing the mirror devices PFET T114 and PFET T113 to turn off and the transistors of level setting device NFET T119 to turn on causing the voltage at output pin 000 to fall to the logical low level equivalent to GND!.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A differential receiver cell circuit for a CMOS chip comprising:

a differential receiver cell having a bias switch circuit between a voltage source and ground comprising a first PFET (T115) having its source connected to the voltage source, its drain connected to a self biasing network composed of a second PFET (T106) and a first NFET (T107) as input transistors to said bias switch circuit and having an output of said first PFET (T115) connected to control a current controlling device of said receiver cell circuit provided by a second NFET (T118) whose drain is connected to a common node (NA) and whose source is coupled to ground;

said differential receiver cell further having a first data input along a first input line to the gate of a first input NFET (T117) whose source is connected to said common node (NA), and said differential receiver cell also has a second data input provided by a second input line to the gate of a second input NFET (T116) whose source is also connected to said common node (NA), said common node (NA) being connected to the drain of said current controlling device provided by said second NFET (T118) whose source is connected to ground;

and wherein said differential receiver cell also has a first current mirror device PFET (T114) and a second current mirror device PFET (T113) connected to a second common node (NB) which is connected to said self biasing network, and having the drain of said first input NFET (T117) connected to the drain of said first current mirror device PFET (T114) at a self biasing network out node (AAA), and the drain of the second input NFET (T116) is connected to the drain of said second current mirror device PFET (T113) at an output node (000); and wherein voltage signals present at both the first data input and second data input are complementary so that if a signal present on said first input line is a high level signal then the signal present on said second input line is a low level signal, and when a re-enable signal is a high level logical signal equivalent to the output node (000) source voltage and a complementary re-enable input pin is at a low level logical signal equivalent to the output node (000) voltage at ground then the input NFET AND PFET transistors of said self biasing network are turned ON and the first PFET (T115) of said bias switch circuit is turned OFF to bias the differential receiver cell circuit at the first and second input lines.

2. A differential receiver cell circuit for CMOS according to claim 1, wherein when the signal at said first data input is at the high level and the second data input signal is at the low level then the first input NFET (T117) is ON and the second input NFET (T116) is OFF, which causes said first input NFET (T117) to steer current from the first current mirror device PFET (T114) causing the voltage at the biasing circuit network out node (AAA) to fall causing the voltage to drop across the self biasing network's second PFET (T106) and first NFET (T107) causing said second common node (NB) to drop driving said mirror device PFETs (T114, T113) to turn ON harder causing the voltage at the output node (000) to rise to a logical high signal.

3. A differential receiver cell circuit for CMOS according to claim 2 wherein a signal drop at the self biasing network out node (AAA) also drives the gate of said current controlling device to drop and to drive less causing said first input NFET (T117) to be OFF causing voltage at the output node (000) to rise.

4. A differential receiver cell circuit for CMOS according to claim 3, wherein when the signal at the first data input is at the low level and the signal at the second data input is at the high level then the first input NFET (T117) is turned OFF while said second input NFET (T116) is turned ON causing voltage at the self biasing network out node (AAA) to rise causing voltage across the self biasing network's second PFET (T106) and first NFET (T107) to rise causing the gate voltage of both said FFET mirror devices (T114,T113) to rise turning said both mirror devices off causing said current controlling device NFET (T118) to turn ON causing said second input NFET (T116) to turn ON harder causing voltage at the output node (000) to fall to a logical low level.

5. A differential receiver cell circuit for CMOS according to claim 4, wherein when the re-enable signal at a first re-enable input (REN) is a logical low level equivalent to voltage at ground and the complementary re-enable signal at a second re-enable input (RENN) is a logical high signal equivalent to voltage at a voltage source node (VDD!) then the self biasing network's second PFET (T106) and first NFET (T107) are turned OFF and the current controlling device NFET (T118) is ON turning ON the first PFET (T115) causing voltage at the second common node (NB) to rise to the level of the source voltage which causes the PFET mirror devices (T114, T113) to turn OFF and a level setting device NFET (T119) to turn ON causing the voltage at the output node (000) to fall to a logical low level equivalent to ground.

* * * * *